United States Patent [19]
Kawamura et al.

[11] 3,960,618
[45] June 1, 1976

[54] EPITAXIAL GROWTH PROCESS FOR COMPOUND SEMICONDUCTOR CRYSTALS IN LIQUID PHASE

[75] Inventors: Masao Kawamura, Fuchu; Kazuhiro Ito, Tokyo; Makoto Morioka, Tokyo; Yuichi Ono, Tokyo; Sachio Ishioka, Tokyo; Kazuhiro Kurata, Hachioji, all of Japan

[73] Assignee: Hitachi, Ltd., Japan

[22] Filed: Mar. 25, 1975

[21] Appl. No.: 561,795

[30] Foreign Application Priority Data
Mar. 27, 1974 Japan.................................. 49-33547

[52] U.S. Cl................................ 148/171; 148/172; 252/62.3 GA; 252/62.3 ZT
[51] Int. Cl.².............................................. H01L 7/38
[58] Field of Search.......................... 148/171, 172; 252/62.3 GA, 62.3 ZT

[56] References Cited
UNITED STATES PATENTS

| | | | |
|---|---|---|---|
| 2,944,321 | 7/1960 | Westberg........................ | 148/171 X |
| 3,192,082 | 6/1965 | Tomono et al. .................... | 148/172 |
| 3,530,011 | 9/1970 | Suzuki et al. ....................... | 148/1.5 |
| 3,677,836 | 7/1972 | Lorenz................................ | 148/171 |
| 3,692,593 | 9/1972 | Hawrylo et al. ..................... | 148/172 |
| 3,697,336 | 10/1972 | Lamorte ............................. | 148/171 |

*Primary Examiner*—G. Ozaki
*Attorney, Agent, or Firm*—Craig & Antonelli

[57] ABSTRACT

In an epitaxial growth process for compound semiconductor crystals in a liquid phase, a substrate crystal is brought into contact with an etching solution containing as solute a predetermined amount of at least one constituent of the substrate crystal, which is smaller than that of a saturated solution, after heating them at a temperature for crystal growth. The substrate crystal is kept in contact with the solution during a period of time sufficient to remove a surface portion of the substrate crystal. Then the substrate crystal is brought into contact with a solution for crystal growth containing a substance to be grown as solute and a crystal of the substance is grown epitaxially on an exposed clean surface of the substrate crystal.

5 Claims, 5 Drawing Figures

EPITAXIAL GROWTH PROCESS FOR COMPOUND SEMICONDUCTOR CRYSTALS IN LIQUID PHASE

BACKGROUND OF THE INVENTION

1. Field of the Invention

The present invention relates to an epitaxial growth process for compound semiconductor crystals and more particularly to a process wherein a crystal, such as $Ga_{1-x}Al_xAs$ (wherein $0 < x \leq 1$), on which an inactive layer is easily formed by chemical reaction with a small amount of impurities contained in surrounding gas due to its chemical activity, or a crystal, such as GaP and GaAs, on which a degenerated layer is formed due to high vapor pressure of its constituent elements, is used as a substrate crystal.

2. Description of the Prior Art

A crystal of GaAs or GaP is widely utilized as a substrate in epitaxial growth processes for III-V compound semiconductor crystals in liquid phase, such as GaP, GaAs, $Ga_{1-x}Al_xAs$ ($0 < x \leq 1$), and $Ga_{1-x}Al_xP$ ($0 < x \leq 1$). In these processes, it is necessary to heat a crystal growth system consisting of a substrate crystal and a solution for crystal growth to a predetermined temperature and to keep it at that temperature during a period of time before the beginning of crystal growth so that the solution for crystal growth is well equilibrated and homogenized. During this period of time, the substrate crystal is exposed to the surrounding gas at a high temperature. In this case, when the substrate is a $Ga_{1-x}Al_xAs$ monocrystal, its surface is covered by an inactive layer, which seems to be an oxide, due to its chemical activity, and therefore it is not possible to obtain an epitaxial layer of high quality. In case the substrate is a monocrystal of GaAs, GaP, Zn Te, or Zn Se, since the dissociation pressure of one component is high at a high temperature, a degenerated layer is formed on the surface of the monocrystal by dissociation of As, P, Zn, Te, or Se at temperatures around the temperature for crystal growth ($600° \sim 1,000°C$.). When the interface between the substrate and the epitaxial layer is used as an active region, for example a p-n junction, the degenerated layer lowers the stability of the active region. Moreover, the degenerated layer has bad influences on the crystallographical properties of the layer grown on it.

In order to overcome this difficulty, several methods have been already proposed. According to one of these methods, after having brought a substrate crystal in contact with a solution for crystal growth, the temperature of the system for crystal growth is raised until the solution becomes subsaturated. The degenerated layer formed at the surface portion of the substrate crystal is dissolved by the subsaturated solution. After that, the temperature is again lowered so that a crystal begins to grow on a clean surface of the substrate. This method has a drawback that, since impurities attached on or included by the substrate crystal are dissolved by the solution together with the constituent of the crystal and mixed with the solution for crystal growth, they are in turn distributed in the grown layer and influence disadvantageously the characteristics of the active region formed in the grown layer or between the substrate crystal and the grown layer.

According to another method, apart from a solution for crystal growth, an etching solution is prepared. After having brought a substrate crystal in contact with the etching solution, a system for crystal growth consisting of the substrate crystal and the two solutions is heated to a temperature for crystal growth. The etching solution becomes subsaturated just as mentioned previously and begins to dissolve a degenerated layer covering the surface of the substrate crystal. After that, the substrate crystal is brought in contact with the solution for crystal growtn so that a crystal begins to grow on a clean surface of the substrate crystal (Japanese patent application No. 46-101899). This method removes the drawback of the first method mentioned above. However, since the substrate crystal is kept in contact with the etching solution during the heating process of about one hour for dissolving the degenerated layer on the surface of the substrate crystal, this method has another drawback that reaction-limited dissolution takes place, by which more easily dissolvable parts, such as parts containing a number of crystallographical defects, of the surface of the substrate crystal are selectively dissolved so that one cannot obtain a flat surface of the substrate crystal. Another disadvantage, which is common to the two methods described above, i.e. to the methods according to which one heats a substrate crystal and an etching solution kept in contact with each other, is that it is difficult to find an optimum condition for obtaining a flat surface, because the dissolution of the surface of the substrate crystal depends considerably upon variations of the speed of the temperature rise, differences of the temperature distribution, etc.

According to still another method, a layer, which is not used as active region, is grown on a substrate crystal and another layer, which is used as an active region, is grown thereon by a multilayer successive growth method. This method has a disadvantage that a device for crystal growth is complicated, because impurities added to a solution for crystal growth, S, Se, Te, Zn and the like for III-V compound semiconductors and Zn, S, Te and the like for II-VI compound semiconductors, for which Bi, In, or Sn is used normally as solvent, are easily vaporized due to their high vapor pressure at high temperature and mixed with other solutions so that the solutions influence each other.

SUMMARY OF THE INVENTION

An object of this invention is to provide an epitaxial growth process for compound semiconductor crystals in a liquid phase which enables one to obtain a homogeneous epitaxial layer having excellent crystallographical properties, even if a crystal having a high dissociation pressure or a strong chemical activity is used as a substrate.

Another object of this invention is to provide an epitaxial growth process for compound semiconductor crystals, which enables one to obtain a clean interface between the epitaxial layer and the substrate so that the interface can be used directly as an active region, such as a p-n junction.

According to this invention, a substrate crystal is brought in contact with an etching solution containing as solute, a predetermined amount of at least one constituent of the substrate crystal, which is smaller than that of a saturated solution, before beginning crystal growth, in order to remove a degenerated layer formed on a surface of the crystal.

The invention will be better understood from the following detailed description thereof taken in conjunction with the drawings. It should, however, be understood that the present invention is not limited to the particular embodiments shown hereinbelow, but various changes and modifications can be made without departing from the spirit of the present invention.

DESCRIPTION OF THE PREFERRED EMBODIMENTS

Embodiment 1

Figure 1:
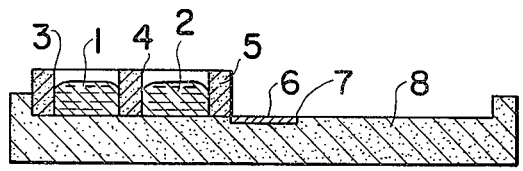
FIGS. 1 to 4 are sectional views of an apparatus for crystal growth, showing various steps of the process of this invention.

FIGS. 1 to 4 show various steps of the process of this invention, in which an apparatus for crystal growth useful in the practice of the invention is shown in sectional view. The apparatus is a boat made of graphite consisting of a lower part 8 and an upper part 5 which can slide on the lower part. A slot 7 is provided in the upper surface of the lower part 8. The slot 7 is large enough to accomodate a substrate crystal 6 which is to be utilized, and the depth of the slot 7 is slightly larger than the thickness of the substrate crystal 6. The substrate crystal 6 is positioned in the slot 7 so that the substrate surface to be deposited with an epitaxial growth is upper most. The upper part has two wells 3 and 4. An amount of solution for crystal growth 1 is placed in the well 3 and an amount of an etching solution 2 is placed in the well 4 so that when the upper part slides from left to right, the substrate crystal is brought in contact with the etching solution 2 at first and then with the solution for crystal growth 1. The precise size and shape of the apparatus is not critical. Advantageously the exposed upper surface of the substrate crystal 6 is parallel to the upper surface of the lower part 8, and the substrate crystal 6 nearly fills the slot 7.

Figure 2:
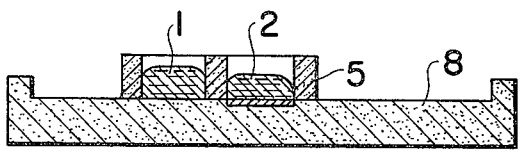
Figure 3:
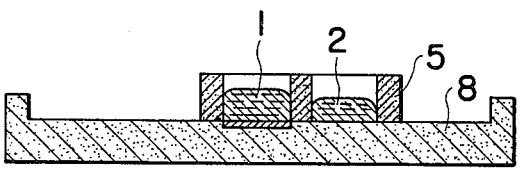
Figure 4:
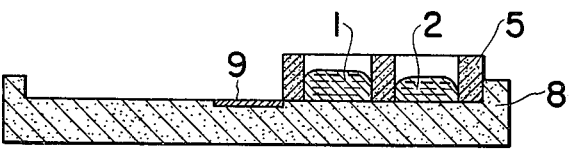
Figure 5:
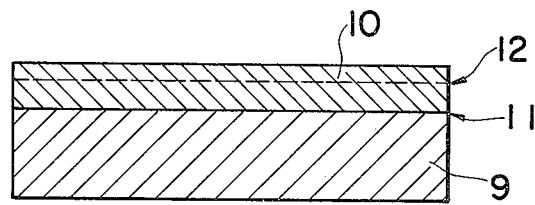
FIG. 5 is a sectional view of a crystal obtained by the process of this invention.

In this example, the substrate crystal 6 consisted of p conductivity type gallium arsenide doped with zinc (carrier concentration $7 \times 10^{17} cm^{-3}$), and was in the form of a square slice about 1 cm wide and about 400μ thick. The solution for crystal growth 1 consisted of 8 grams gallium, 2.4 grams gallium arsenide and 1 milligram tellurium. The etching solution 2 consisted of 4 grams gallium and 1.02 grams gallium arsenide. This etching solution is unsaturated with respect to gallium arsenide at a temperature of 900°C. and can still dissolve about 0.02 grams gallium arsenide until it becomes completely saturated. After having placed the solution for crystal growth 1, the etching solution 2, the substrate crystal 6, the upper and lower parts of the apparatus 5 and 8 as indicated in FIG. 1, they were heated to a temperature of 900°C. in an inert or reductive gas atmosphere, e.g. He, Ar or $H_2$. This temperature was kept during a period of time of about 20 minutes so that the two solutions were completely homogenized. The substrate crystal 6 was brought in contact with the etching solution 2 by sliding the upper part of the apparatus as indicated in FIG. 2 and kept in contact during a period of time of about 1 minute so that a degenerated surface portion of the substrate crystal 6 was dissolved by the etching solution. Then the upper part 5 of the apparatus was further slid so that the substrate crystal left the etching solution, which had dissolved the surface portion and had been almost saturated with gallium arsenide, and the substrate crystal 9 which had no degenerated layer, came in contact with the solution for crystal growth 1 which was a saturated solution, as indicated in FIG. 3. A crystal was grown epitaxially on a clean surface of the substrate crystal by cooling the whole system for crystal growth with a rate of 1°C/min. When the temperature decreased to 870°C., the upper part 5 of the apparatus was further slid so that the substrate crystal 6 left the solution for crystal growth 1 as indicated in FIG. 4. FIG. 5 shows the structure of the crystal thus obtained in sectional view. It was observed that a surface portion about 40μ thick of the original substrate crystal 6 was removed and an n conductivity type gallium arsenide layer 10 about 50μ thick of excellent homogeneity (carrier concentration $6 \times 10^{17} cm^{-3}$) was deposited on a clean surface 11 of the substrate crystal 9 having no degenerated layer. In FIG. 5 a broken line 12 represents the surface of the original substrate crystal 6. The intensity of emitted light was measured for a number of diodes by applying a voltage to the p-n junction thus obtained in the forward direction. Fluctuation of the intensity for the same intensity of current passing through the p-n junction was about 0.2~0.3%.

As it is already mentioned, 4 grams gallium dissolve about 1.04 grams gallium arsenide at a temperature of 900°C. If a degree of saturation is represented by a ratio of a mass of solute existing in a solution to that existing in a saturated solution at a determined temperature, the degree of saturation of the etching solution used in the above-mentioned example was 98%. For etching solutions having a degree of saturation greater than this value, dissolution takes place too slowly and the etching solutions cannot be used for practical purposes.

An etching solution consisting of 4 grams gallium and 0.62 grams gallium arsenide dissolves further about 0.42 grams gallium arsenide at a temperature of 900°C. The degree of saturation of this etching solution is 60%. This etching solution dissolves in 5 seconds the same quantity of the degenerated surface portion as that dissolved in 1 minute in the above-mentioned example. Etching solutions having a degree of saturation smaller than this value dissolve the gallium arsenide substrate crystal too rapidly. Consequently, by using these solutions, it is difficult not only to control the quantity of dissolved material but also to obtain a flat surface of the substrate after the dissolution, and therefore the present invention cannot be applied advantageously. When gallium arsenide is used as a substrate crystal, the degree of saturation of the etching solution is advantageously between 60 and 98%.

In the above example, the temperature is kept constant during the dissolution. However, good results have been obtained also by beginning to decrease the temperature just before bringing the substrate crystal in contact with the etching solution.

Embodiment 2

A substrate crystal 6 used for obtaining gallium phosphide light emitting diodes was a wafer consisting of an n conductivity type layer 20μm thick doped with sulfur grown by traditional epitaxial crystal growth method on a surface (111) of an n conductivity type gallium phosphide monocrystal wafer about 400μ thick doped with sulfur having a diameter of 20 mm. The n conductivity type layer epitaxially grown was necessary, because no gallium phosphide wafers satisfactory for fabricating light emitting diodes were available. A solution for crystal growth 1 consisted of 20 grams gallium and 0.65 grams gallium phosphide. As an etching solution a mixture of 10 grams gallium and 0.283 grams gallium phosphide was used. These were placed on a graphite boat just as indicated in Embodiment 1. Then the graphite boat was placed in a quartz tube, through which $H_2$-diluted 5% $NH_3$ gas and $H_2$ gas flowed at a rate of 40 cc/min. and 700 cc/min. respectively, together with vapor from a source of zinc located at a position up-stream with respect to the boat and kept at a temperature of about 550°C. This system for crystal growth was heated to 950°C. and kept at this temperature during a period of time of 15 minutes. The substrate was kept in contact with the etching solution 2 during a period of time of 40 seconds, and then brought in contact with the solution for crystal growth just as described in Embodiment 1. The system for crystal growth was cooled at a rate of 5°C./min to 900°C., at which the substrate was removed from the solution for crystal growth by sliding the upper part 5 of the boat. A p conductivity type gallium phosphide layer thus epitaxially grown had a uniform thickness of about 15 $\mu$m. When an electric current flowed through a p-n junction thus obtained in the forward direction, an emission of green light having a wavelength of 5,600 A generated by recombination of injected minority carriers was observed. External quantum efficiency of this emission was 0.07%. This value is quite satisfactory, because the external quantum efficiency is normally 0.03% for the green light emitting diodes fabricated by a traditional epitaxial growth process without dissolution of a surface portion of a substrate.

At a temperature of 950°C. 10 grams gallium can dissolve 0.300 gram gallium phosphide. Consequently the degree of saturation in the above example is 94%. It is preferable that the degree of saturation of an etching solution for gallium phosphide is comprised between 60 and 98% for the same reason as that described in Embodiment 1. Therefore, the amount of gallium phosphide dissolved beforehand in 10 grams gallium is preferably comprised between 0.180 and 0.294 grams. Under the same conditions as described above except for the dissolved amount of gallium phosphide in the etching solution the substrate crystal is kept in contact with the etching solution during 5 and 40 seconds for 0.180 and 0.294 grams dissolved gallium phosphide, respectively.

Embodiment 3

A substrate crystal 6 used for obtaining gallium aluminum arsenide light emitting diodes was a wafer consisting of p conductivity type $Ga_{1-x}Al_xAs$ layer ($x \approx 0.12$, doped with germanium, carrier concentration of about $2 \times 10^{18} cm^{-3}$) about 300$\mu$ thick grown by traditional epitaxial crystal growth method on a surface of a p conductivity type gallium arsenide monocrystal square shaped wafer (15 × 15mm$^2$, doped with zinc, carrier concentration of about $5 \times 10^{18}$ cm$^{-3}$). A solution for crystal growth 1 consisted of 8 grams gallium, 0.58 grams gallium arsenide, 0.005 grams aluminum, and 0.002 grams tellurium. As an etching solution, a mixture of 4 grams gallium, 0.05 grams aluminum and 0.05 grams gallium arsenide was used. These were placed on a graphite boat just as indicated in Embodiment 1.

The substrate and the solutions were heated to 850°C. and kept at this temperature during a period of time of 20 minutes. The temperature began to decrease at a rate of 1°C./min. and at the same time, the substrate was brought in contact with the etching solution 2. The substrate was kept in contact with the etching solution during a period of time of 40 seconds, whereby a surface portion about 10$\mu$ thick was removed, and then brought in contact with solution for crystal growth 1, while the temperature continued to decrease at the same rate. By this method, an n conductivity type $Ga_{1-x}Al_xAs$ ($x \approx 0.15$, doped with Te, carrier concentration of about $2 \times 10^{18}cm^{-3}$) was grown epitaxially on the substrate. When an electric current flowed through a p-n junction thus obtained, an emission of light having a wavelength of 8,000 A was observed. It was also possible to obtain light emitting diodes, in which light is emitted in the perpendicular direction to the p-n junction, by removing the p conductivity type gallium arsenide layer.

A solution consisting of 4 grams gallium and 0.05 grams aluminum can dissolve about 0.08 grams gallium arsenide at a temperature of 850°C. The amount of gallium arsenide which can be dissolved in the solution decreases with increasing aluminum content. When a substrate crystal containing aluminum is brought in contact with an etching solution, a part of the substrate crystal is dissolved by the solution and aluminum content of the solution increases, this makes gallium arsenide less soluble. Consequently, when a substrate crystal contains aluminum, the degree of saturation with respect to gallium arsenide suitable for this invention should be smaller than that observed for substrate crystals which contain no aluminum. It is observed that the degree of saturation is preferably comprised between 30 and 60% for substrate crystals containing aluminum. Thus, the amount of gallium arsenide added to a mixture of 4 grams gallium and 0.05 grams aluminum suitable for etching solution is preferably between 0.024 and 0.05 grams. For these contents of gallium arsenide suitable contact time of the substrate crystal with the etching solution is 10 and 30 seconds, respectively. The ratio of the weight of aluminum with respect to that of gallium should be comprised between 0.25 and 1.25%. If aluminum content of an etching solution is greater than 1.25 weight %, the amount of gallium arsenide, which can be dissolved, is too small and therefore the etching solution is not suited for this invention. To the contrary, etching solutions containing aluminum less than 0.25 weight % dissolve no oxide film produced on the surface of compound semiconductor crystals containing aluminum, which are easily oxidized; 4 grams gallium suitable for etching solution for gallium aluminum arsenide should contain at least 0.01 gram aluminum and this solution can dissolve 0.24 grams gallium arsenide. For the solution consisting of 4 grams gallium and 0.01 gram aluminum also the degree of saturation suitable for etching solution should be comprised between 30 and 60%. Thus, the amount of gallium arsenide added to this mixture is between 0.07 and 0.14 grams. For these contents of gallium arsenide suitable contact time of the substrate crystal with the etching solution is 5 seconds and 1 minute, respectively.

In the above example, descriptions are made only on gallium aluminum arsenide, but it was verified that for gallium aluminum phosphide, the suitable content range of aluminum and the preferable degree of saturation are also identical to those observed for gallium aluminum arsenide.

It is apparent that the present invention can be applied to other III–V compound semiconductors such as $In_{1-x}Ga_xSb$ ($0 \leq x \leq 1$) as well as to II–VI compound semiconductors, such as $CdS_{1-x}Se_x$ ($0 \leq x \leq 1$) and $ZnTe_{1-x}Se_x$ ($0 \leq x \leq 1$).

It will also be appreciated that for III–V compounds, Ga is used almost exclusively as a solvent, probably because of its very low melting point. For II–VI compounds Bi, In or Te is used. One determines what solvent should be used, taking into account its availability, its melting point, its behavior as impurities when it is contained in a grown crystal, etc. Our etching solution contains all of the constituent elements of the compound semiconductor forming the substrate crystal.

Further possible combinations of semiconductor compounds to be grown are indicated in the following table:

TABLE

| Substrate | Etching Solution | Combination | Epitaxial Layer | Solution for Growth | Temperature |
|---|---|---|---|---|---|
| GaAs | Ga 4 g | | GaAs | Ga 8 g | 900 → 870°C |
| | GaAs 0.62 – 1.02 g | | | GaAs 2.4g | |
| GaAlAs | Ga 4 g<br>Al 0.01 – 0.05 g<br>GaAs 0.024 – 0.14 g | | GaAlAs | Ga 8 g<br>Al 0.005 g<br>GaAs 0.58 g | 850 → 800°C. |
| GaP | Ga 10 g | | GaP | Ga 20 g | 950 → 900°C. |
| | GaP 0.18 – 0.29 g | | | GaP 0.65 g | |
| GaAlP | Ga 4 g<br>Al 0.01 – 0.05 g<br>GaP 0.01 – 0.05 g | | GaAlP | Ga 10 g<br>Al 0.005 g<br>GaP 0.2 g | 950 → 900°C. |
| ZnSe | Bi 20 g<br>ZnSe 0.07 g | | ZnTe | Bi 20 g<br>Zn Te 2.5 g | 800 → 700°C. |
| | In 10 g | | | In 10 g<br>ZnTe 2.5 g | 800 → 700°C. |
| | ZnSe 0.1 g | | | Te 10 g<br>ZnTe 2 g | 800 → 700°C. |

While the novel embodiments of the invention have been described, it will be understood that various omissions, modifications and changes in these embodiments may be made by one skilled in the art without departing from the spirit and scope of the invention.

What is claimed is:

1. An epitaxial growth process for compound semiconductor crystals of III–V and II–VI compounds in liquid phase comprising:
    preparing a substrate crystal of a compound semiconductor,
    preparing an etching solution containing the constituent elements of said compound semiconductor, which is unsaturated with respect to the solute at a temperature at the beginning of crystal growth,
    preparing a solution for crystal growth containing a III–V or II–VI compound to be grown,
    heating said substrate crystal, said etching solution and said solution for crystal growth to the temperature at the beginning of crystal growth,
    bringing said substrate in contact with said etching solution,
    bringing said substrate in contact with said solution for crystal growth just after having removed said substrate crystal from said etching solution, and
    growing epitaxially a crystal of said compound semiconductor on said substrate crystal.

2. An epitaxial growth process for compound semiconductor crystals in liquid phase according to claim 1, wherein a speed of dissolution of said substrate crystal by said etching solution is controlled by controlling a degree of saturation of the solute within said etching solution.

3. An epitaxial growth process for compound semiconductor crystals in liquid phase according to claim 2, wherein said substrate crystal is made of one selected from the group consisting of gallium phosphide and gallium arsenide, the solvent of said etching solution being gallium, said degree of saturation represented by the ratio of an amount of solute in said etching solution with respect to an amount of solute in a saturated solution being comprised between 60 and 98%.

4. An epitaxial growth process for compound semiconductor crystals in liquid phase according to claim 2, wherein said substrate crystal is made of one selected from the group consisting of gallium aluminum arsenide and gallium aluminum phosphide, the solvent of said etching solution being gallium, the amount of aluminum with respect to that of gallium by weight being comprised between 0.25 and 1.25%, said degree of saturation with respect to the other two elements forming the solute being comprised between 30 and 60%.

5. An epitaxial growth process for compound semiconductor crystals in liquid phase according to claim 1, wherein both said substrate crystal and said compound semiconductor to be grown are a III–V compound semiconductor.

* * * * *